United States Patent
Ho et al.

(10) Patent No.: US 7,932,563 B2
(45) Date of Patent: Apr. 26, 2011

(54) TECHNIQUES FOR IMPROVING TRANSISTOR-TO-TRANSISTOR STRESS UNIFORMITY

(75) Inventors: Jung-Ching J. Ho, Fremont, CA (US); Jane W. Sowards, Fremont, CA (US); Shuxian Wu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 198 days.

(21) Appl. No.: 12/363,666

(22) Filed: Jan. 30, 2009

(65) Prior Publication Data

US 2010/0193870 A1  Aug. 5, 2010

(51) Int. Cl.
*G06F 17/50* (2006.01)

(52) U.S. Cl. .............. 257/365; 703/15; 438/1; 365/72

(58) Field of Classification Search ............ 257/365
See application file for complete search history.

(56) References Cited

U.S. PATENT DOCUMENTS

| | | |
|---|---|---|
| 6,461,905 B1 | 10/2002 | Wang et al. |
| 6,875,680 B1 | 4/2005 | Park |
| 7,049,185 B2 | 5/2006 | Ito |
| 7,423,283 B1* | 9/2008 | Luo et al. .................. 257/19 |
| 2006/0220066 A1* | 10/2006 | Yoshida .................. 257/204 |
| 2007/0228279 A1* | 10/2007 | Matsumoto et al. ....... 250/336.1 |
| 2007/0246776 A1* | 10/2007 | Moroz et al. .............. 257/349 |
| 2007/0267707 A1* | 11/2007 | Tsutsui .................. 257/412 |
| 2008/0003789 A1* | 1/2008 | Chen et al. .............. 438/585 |
| 2008/0014690 A1* | 1/2008 | Chu et al. ............... 438/197 |
| 2008/0057653 A1* | 3/2008 | Chidambarrao et al. .... 438/301 |
| 2008/0296699 A1 | 12/2008 | Hong et al. |
| 2009/0023261 A1 | 1/2009 | Hirano |
| 2009/0189199 A1* | 7/2009 | Moriyama et al. ......... 257/255 |
| 2009/0190387 A1* | 7/2009 | Kim ..................... 365/72 |
| 2010/0019325 A1* | 1/2010 | Nakamura et al. ......... 257/369 |

FOREIGN PATENT DOCUMENTS

| | | |
|---|---|---|
| EP | 1 858 067 A1 | 11/2007 |
| WO | WO 2008/025661 A1 | 3/2008 |
| WO | WO 2008/108339 A1 | 9/2008 |

OTHER PUBLICATIONS

Moroz et al, "analyzing strained-silicon options for stress-engineering transistors", Solid State Technology, Jul. 2004.*

Aikawa H. et al., "Variability Aware Modeling and Characterization in Standard Cell in 45 nm CMOS with Stress Enhancement technique," *2008 Symposium on VLSI Technology, Digest of Technical Papers*, Jun. 17, 2008, pp. 90-91, IEEE, Piscataway, New Jersey, USA.

* cited by examiner

*Primary Examiner* — N Drew Richards
*Assistant Examiner* — Peter Bradford
(74) *Attorney, Agent, or Firm* — Scott Hewett; LeRoy D. Maunu; Lois D. Cartier

(57) ABSTRACT

An integrated circuit has a transistor with an active gate structure overlying an active diffusion area formed in a semiconductor substrate. A dummy gate structure is formed over a diffusion area and separated from the active gate structure by a selected distance ($d_2$). A stress layer overlying the transistor array produces stress in a channel region of the transistor.

15 Claims, 5 Drawing Sheets

TECHNIQUES FOR IMPROVING TRANSISTOR-TO-TRANSISTOR STRESS UNIFORMITY

FIELD OF THE INVENTION

This invention relates generally to techniques for fabricating integrated circuits, and more particularly to improving uniformity of carrier mobility by improving uniformity of linear stress in single transistor or a transistor array.

BACKGROUND OF THE INVENTION

Integrated circuits ("ICs") often include metal-oxide-semiconductor ("MOS") field-effect transistors ("FETs") to implement circuit functions. MOS FETs generally have a gate electrode separated from a channel region in the semiconductor by a thin layer of gate oxide or other insulating material. Current flow through the channel between drain/source regions according to the gate bias and other factors, such as carrier mobility.

Carrier mobility has been found to be affected by linear stress in the channel region along the major plane of the IC substrate or chip. The carrier mobility in a MOS transistor has a significant impact on power consumption and switching performance. Improving carrier mobility can improve switching speed of a MOS transistor and other characteristics of the transistor. For NMOS transistors, tensile stress in the channel material improves carrier mobility, and for PMOS transistors, compressive stress improves carrier mobility. One mechanism to improve channel mobility is to form a stress-inducing layer over the MOS FET that applies tensile or compressive stress along the plane of the wafer, i.e., along the channel of the MOS FET.

It is desirable to provide consistent transistor characteristic in many circuit applications fabricated in an IC. For example, it might be desirable in some instance to provide matched transistors having essentially equal speed or current draw. In other instances, it is desirable that modeled transistor performance closely match actual transistor performance. Conventional stress-inducing techniques often result in uneven or unequal channel stress, and hence unequal performance or actual performance that is different from modeled performance.

SUMMARY OF THE INVENTION

An IC has a transistor with an active gate structure overlying an active diffusion area formed in a semiconductor substrate. A dummy gate structure is formed over a diffusion area and separated from the active gate structure by a selected distance. A stress layer overlying the transistor array produces stress in a channel region of the transistor.

DETAILED DESCRIPTION

Figure 1A:
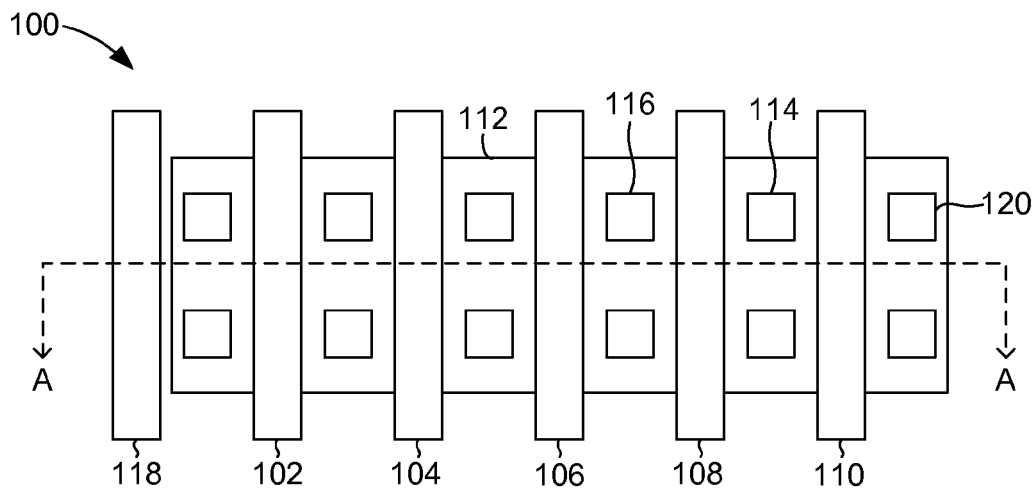
FIG. 1A is a plan view of a transistor array according to an embodiment.

FIG. 1A is a plan view of a transistor array 100 in an IC according to an embodiment. The transistor array 100 has four active gate structures 102, 104, 106, 108 and a dummy gate structure 110. Contacts to the gate structures and the dummy gate structure are omitted for clarity of illustration, as they are well understood in the art. In one embodiment, the active gate structure and dummy gate structures are fabricated from polysilicon ("poly gates"). In an alternative embodiment, the gate structures are metal gates, such as are used in high-k dielectric metal gate ("HKMG") devices.

In a particular embodiment, the gate structures are polysilicon ("poly"), metal, or silicide strips, as is well known in the art of IC fabrication. The four active gate structures overlie a diffusion area 112, and provide the gate terminals for four transistors. The transistors are all NMOS FETs or alternatively all PMOS FETs. A stress layer (either tensile or compressive, according to the type of FETs, also known as a liner layer) overlies the transistor array and enhances carrier mobility in the associated channel regions.

Source/drain contacts 114, 116 are shown on either side of each active gate structure and provide the source/drain terminals for the transistors. Those of skill in the art appreciate that whether a transistor terminal operates as the drain or as the source of a particular transistor depends on how the terminals are electrically connected relative to each other. These contacts and areas will be referred to as source/drain ("S/D") for purposes of convenient discussion.

The gate structure 110 is electrically connected such that it is inactive, in that it does not perform any electronic function, but provides symmetry so that the stress seen by the adjacent gate structure 108 is essentially equal on both sides. If the dummy gate structure 110 were omitted, the length of the stress layer (see FIG. 1B) to the right of the gate structure 108 would be greater than the length of the stress to the right of the gate structure 106. This would result in the channel stress associated with gate structure 108 being greater than the channel stress associated with gate structure 106, creating unequal carrier mobilities and differences in operation between transistors in the array. The dummy gate structure improves matching performance characteristics between the transistor associated with gate structure 108 and the transistor associated with gate structure 106.

An on-field dummy poly strip 118 is included at the opposite end of the transistor array 100 to provide improved stress symmetry to the transistor associated with gate structure 102. The on-field dummy strip 118 is fabricated on the field oxide, not over the active area, and on-field dummy strips are used in conventional ICs, often between active diffusion areas; however, IC design layout often precludes on-field dummy strips on both sides of an active diffusion area. One embodiment uses an on-field dummy strip on one end of a transistor array, and a dummy gate structure over the active diffusion area on the opposite end of the transistor array to match stress, and hence operating characteristics, between the transistors in the transistor array.

The dummy gate structure 110 is separated from the active diffusion area by a thin layer of gate dielectric 111. The dummy gate structure 110 is biased to the same voltage V (e.g., ground potential or $V_{CC}$) as the contact 114 on one side of the dummy gate structure and as the contact 120 on the other side to minimize leakage current under the dummy gate structure. In an alternative embodiment, the end contact 120 and the dummy gate structure 110 are at the same voltage, while the intermediate contact 114 is at a different voltage. The on-field dummy strip 118 is typically left floating because it does not span an active area.

Figure 1B:
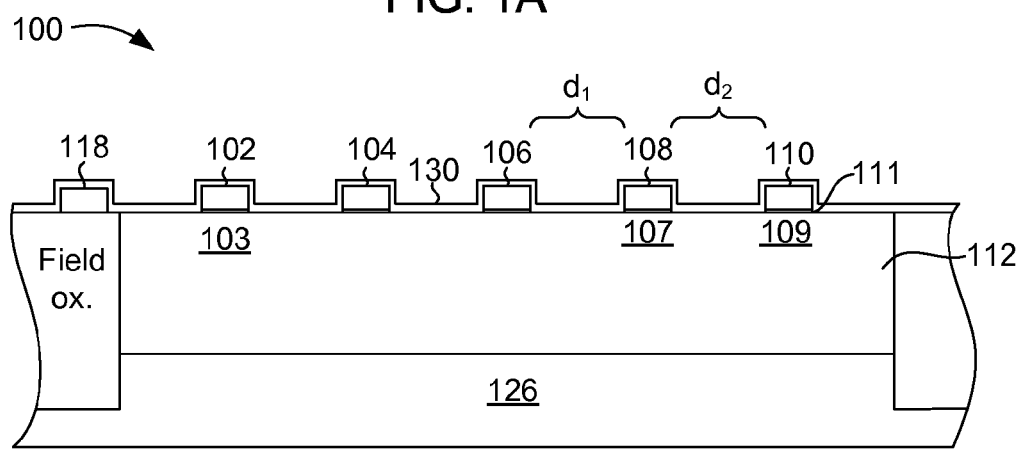
FIG. 1B is a side view of the transistor array of FIG. 1A.

FIG. 1B is a side view of the transistor array 100 of FIG. 1A taken along section line A-A. The gate structures 102, 104, 106, 108 overlie the active area (diffusion) 112 that is formed in a semiconductor substrate 126 of an opposite carrier type. For example, the semiconductor substrate (bulk) 126 is P-type silicon, and the diffusion area 112 has been processed (e.g., by ion implantation) to form N-type silicon.

A stress layer 130 overlies the transistor array to provide selected stress and improve carrier mobility in the transistors. In a particular embodiment, the stress layer 130 is a layer of silicon nitride. Several techniques for forming silicon nitride stress layers and stress layers of other materials are known in the art.

The distance $d_1$ between the gate structure 108 and the adjacent gate 106 is essentially equal to the distance $d_2$ between the gate structure 108 and the dummy gate structure 110, resulting in symmetrical stress on either side of the gate structure 108. In a further embodiment, the distance between each gate structure and associated adjacent gate structures is essentially equal, which provides linear stress uniformity for the transistors in the array.

The dummy gate structure provides stress in the end channel region 109 that matches stress in the adjacent channel region 107 of middle transistors in the transistor array. This matches conductance characteristics of the end channel 109 to the middle channel 107. An on-field dummy gate structure 118 provides stress matching and similarly matches conduction in the end channel 103 on the opposite end of the transistor array. In an alternate embodiment, the diffusion is extended (e.g., to the left, as viewed) and a second dummy gate structure (electrically connected as described for dummy gate structure 110) is provided so that there are two dummy gate structures, one on each end of the transistor array.

Dummy gate structures are also desirable for matching actual transistor performance with modeled performance. For example, IC performance is often modeled in SPICE™. The model is often developed with a particular physical transistor in mind (e.g., the transistor associated with active gate structure 106). In a conventional IC, an end transistor in a transistor array would have actual performance characteristics different than the modeled characteristics. This is commonly known as a "gap" between the modeled and actual performance, which can lead to unreliable or unexpected circuit operation. Alternative embodiments use dummy gate structures on either side of a single active gate structure, or dummy gate structures on each end of a two-transistor array.

Figure 1C:
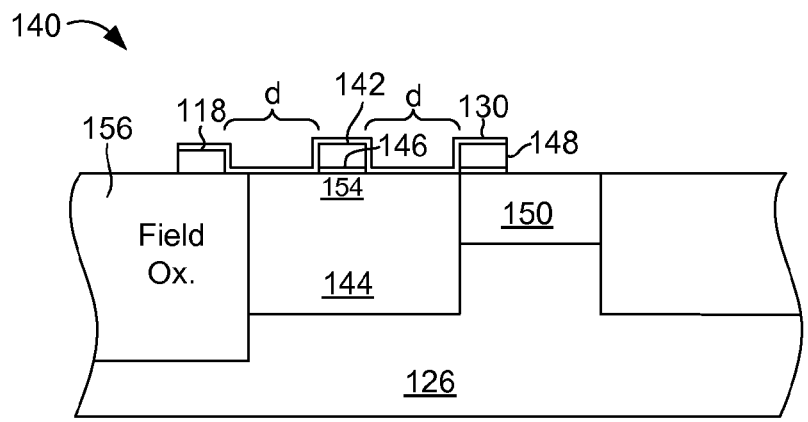
FIG. 1C is a cross section of a transistor according to an embodiment.

FIG. 1C is a cross section of a transistor 140 according to another embodiment. The transistor 140 has an active gate structure 142 separated from an active diffusion 144 formed in a semiconductor substrate 126 by a gate dielectric layer 146. A dummy gate structure 148 overlies a butting diffusion 150. In a particular embodiment, the dummy gate structure 148 is separated from the butting diffusion by the gate dielectric layer. The dummy gate structure 148 is left electrically floating, or alternatively is biased to the potential of the active and butting diffusions. Alternatively, a dummy gate structure partially overlies the butting diffusion 150 and partially overlies the active diffusion 144 (see, e.g., FIG. 2B, ref. num. 210, overlying butting diffusion 220) or overlies the active diffusion 144 adjacent to the butting diffusion 150 (see, e.g., FIG. 3A, ref. num. 304).

A stress layer 130 overlies the transistor 140. The dummy gate structure 148 is separated from the active gate structure 142 by a distance d to provide a selected stress in the channel region 154 of the transistor 140. An on-field dummy strip 118 on field oxide 156, also separated from the active gate structure 142 by the distance d, provides selected, symmetric stress to the channel region 154 in cooperation with the dummy gate structure. Alternatively, a second dummy gate structure according to an embodiment is used instead of the on-field dummy strip. The dummy gate structure in combination with the on-field dummy strip or second dummy gate structure matches the electrical characteristics of the transistor 140 to a transistor model used in a simulation of an IC incorporating the transistor 140 or to another transistor in the IC.

Figure 2A:
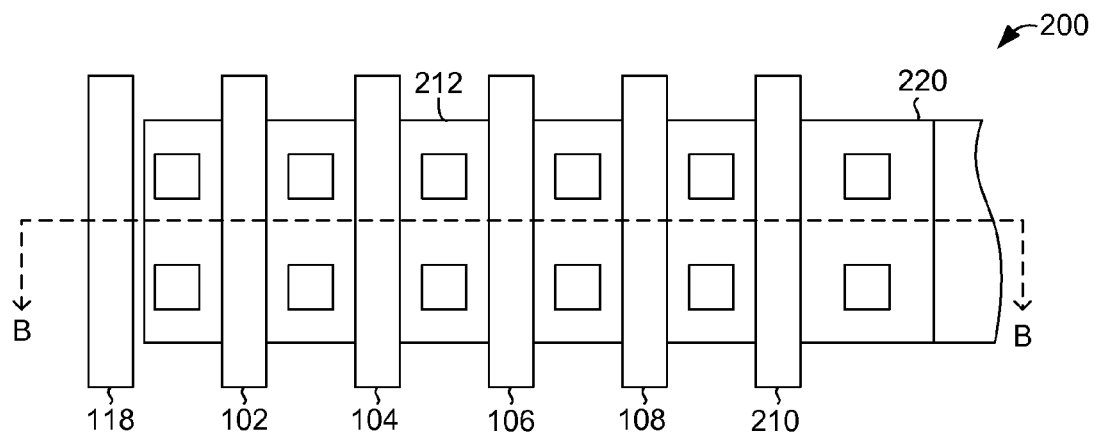
FIG. 2A is a plan view of a transistor array according to an alternative embodiment.

FIG. 2A is a plan view of a transistor array 200 according to an alternative embodiment. Gate structures 102, 104, 106, 108 overlie an active diffusion 212 generally as described above in reference to FIGS. 1A and 1B. A dummy gate structure 210 overlies a boundary (see FIG. 2B, ref. num. 221) between the active diffusion 212 (see FIG. 2B) and a butting diffusion 220 (see FIG. 2B). The butting diffusion 220 is of the same carrier type as the active diffusion 212. For example, if the active diffusion 212 is an N-type diffusion, the butting diffusion is an P+ diffusion. The butting diffusion is used to make electrical connection to the substrate 126 and the adjacent active diffusion 212, and hence is typically at essentially the same voltage as the active diffusion, so dummy gate structures adjacent to or overlying butting diffusions can be left floating. Alternatively, the dummy gate structure is biased to the same voltage as the butting diffusion. In alternative embodiments, a dummy gate structure overlies an end portion of the active diffusion next to the butting diffusion (see, e.g., FIG. 3A, ref. num. 304) or overlies the butting diffusion next to the active diffusion (see, e.g., FIG. 3B, ref. num. 324).

In a further embodiment, a second transistor array extends from the opposite side of the butting diffusion (i.e., to the right of the butting diffusion), so that a single butting diffusion (well tap) can be used in association with two transistor arrays. An on-field dummy strip 218 (FIG. 2B) is included in a further embodiment. In an alternative embodiment, the active diffusion is extended (e.g., further to the left of gate structure 102) and a second dummy gate structure is included in the transistor array (see, e.g., FIG. 3A, ref. num. 302). In another embodiment, a second butting diffusion is adjacent to the opposite end (i.e., the left end) of the active diffusion, and a second dummy gate structure is provided over the second butting diffusion to equalize stress in the end transistor associated with gate structure 102.

Dummy gate structures overlying butting diffusions or at the butting/active diffusion boundary can be left floating because the butting and active diffusions are at equal voltage under the dummy gate structure.

Figure 2B:
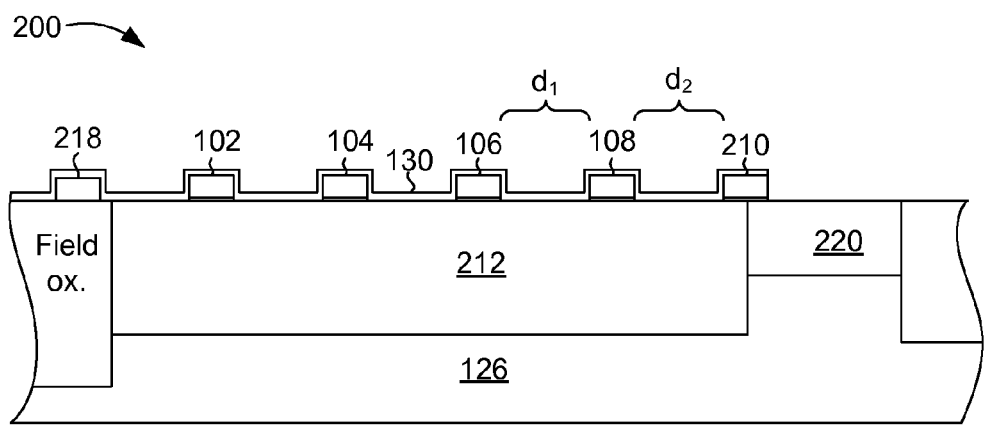
FIG. 2B is a side view of the transistor array of FIG. 2A.

FIG. 2B is a side view of the transistor array 200 of FIG. 2A taken along section line B-B. The dummy gate structure 210 overlies the boundary 221 between the active diffusion 212 and the butting diffusion 220, and is spaced a distance $d_2$ from the end active gate structure 108 essentially equal to the distance $d_1$ between the end active gate structure 108 and the middle active gate structure 106. An on-field dummy poly strip 218 provides symmetrical stress from stress layer 130 to the opposite end active gate structure 102, matching the carrier mobilities of the transistors associated with the end gate structures with the mobilities of the transistors associated with the middle active gate structures. Source/drain diffusions are omitted from the illustration for clarity of illustration, as they are well-understood by those of skill in the art of FET fabrication and design.

The active diffusion 212 and butting diffusion 220 are formed in a substrate 126, which is the opposite semiconductor type. For example, the substrate 126 is P-type silicon and the butting diffusion (also called butting tab) 220 is doped to be P+ silicon and the active diffusion is N+ doped. The dummy gate structure 210 overlies the active diffusion 212 next to the butting diffusion 220, which holds equal potential with the active diffusion and results in no current flow under the dummy gate structure. Thus, the dummy gate structure may be left floating.

Figure 3A:
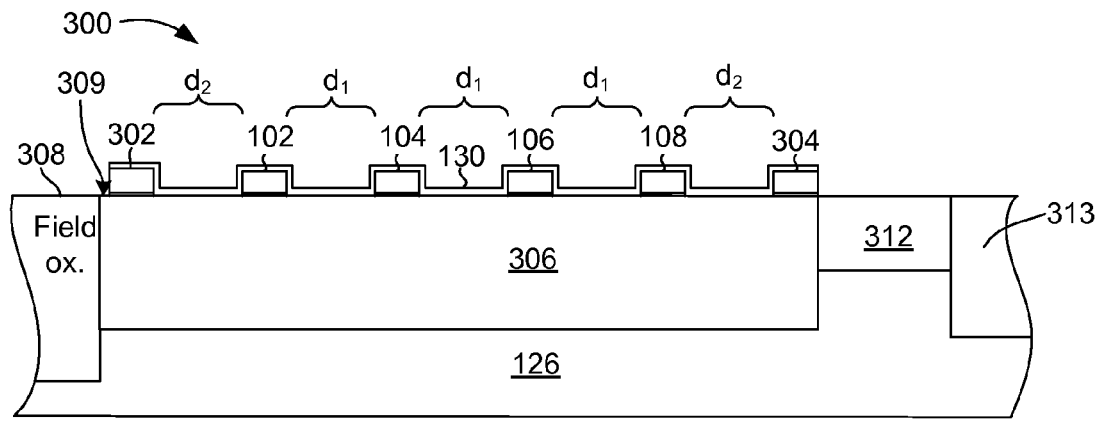
FIG. 3A is a cross section of a transistor array according to embodiments.

FIG. 3A is a cross section of a transistor array 300 with a combination of embodiments. The transistor array has four active gate structures 102, 104, 106, 108 and two dummy gate structures 302, 304. The first dummy gate structure 302 is formed over the active area 306 of the transistor array and may be left floating because it abuts field oxide 308, separated by a setback 309 from the edge of the field oxide 308. The setback is about thirty nano-meters in a forty-five nano-meter node technology, and is provided to prevent poly or other gate material being deposited in a gap (not shown) that can form between the field oxide and active silicon under some conditions. Other node technologies will have alternative setback dimensions. Gate conductor material in the oxide-silicon gap can cause electrical shorts and other problems if the dummy gate is not setback from the edge of the field oxide.

The second dummy gate structure 304 is formed on the active diffusion 306 adjacent to a butting diffusion 312. The second dummy gate structure 304 is optionally left electrically floating, or alternatively is connected to the butting diffusion (active diffusion) potential. A stress layer 130 overlies the transistor array and produces stress in the channel regions under the four active gate structures 102, 104, 106, 108, which enhances carrier mobility. The dummy gate structures 302, 304 insure the transistors at the ends of the transistor array (i.e., the transistors associated with active gates 102 and 108) have conduction characteristics matched to the transistors in the middle of the transistor array (i.e., 104, 106). An optional second active diffusion 313 extends from the butting diffusion 312 which contains a similar set of dummy gate structures such as 304, 108.

Figure 3B:
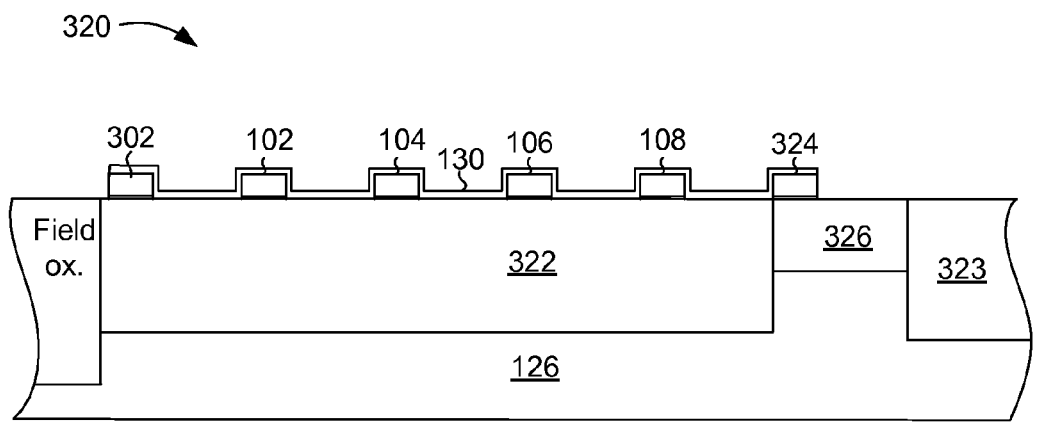
FIG. 3B is a cross section of a transistor array according to alternative embodiments.

FIG. 3B is a cross section of a transistor array 320 with a combination of embodiments. A first dummy gate structure 302 is formed over the active diffusion 322 (see, FIG. 3A, ref. num. 302, above) and a second dummy gate structure 324 is formed over a butting diffusion 326. A stress layer overlies the transistor array 320 and produces stress in the channel regions of the transistors associated with active gate structures 102, 104, 106, 108. The spacing between the active gate structures and the dummy gate structures is essentially equal. An optional second active diffusion 323 extends from the butting diffusion 326.

Figure 4:
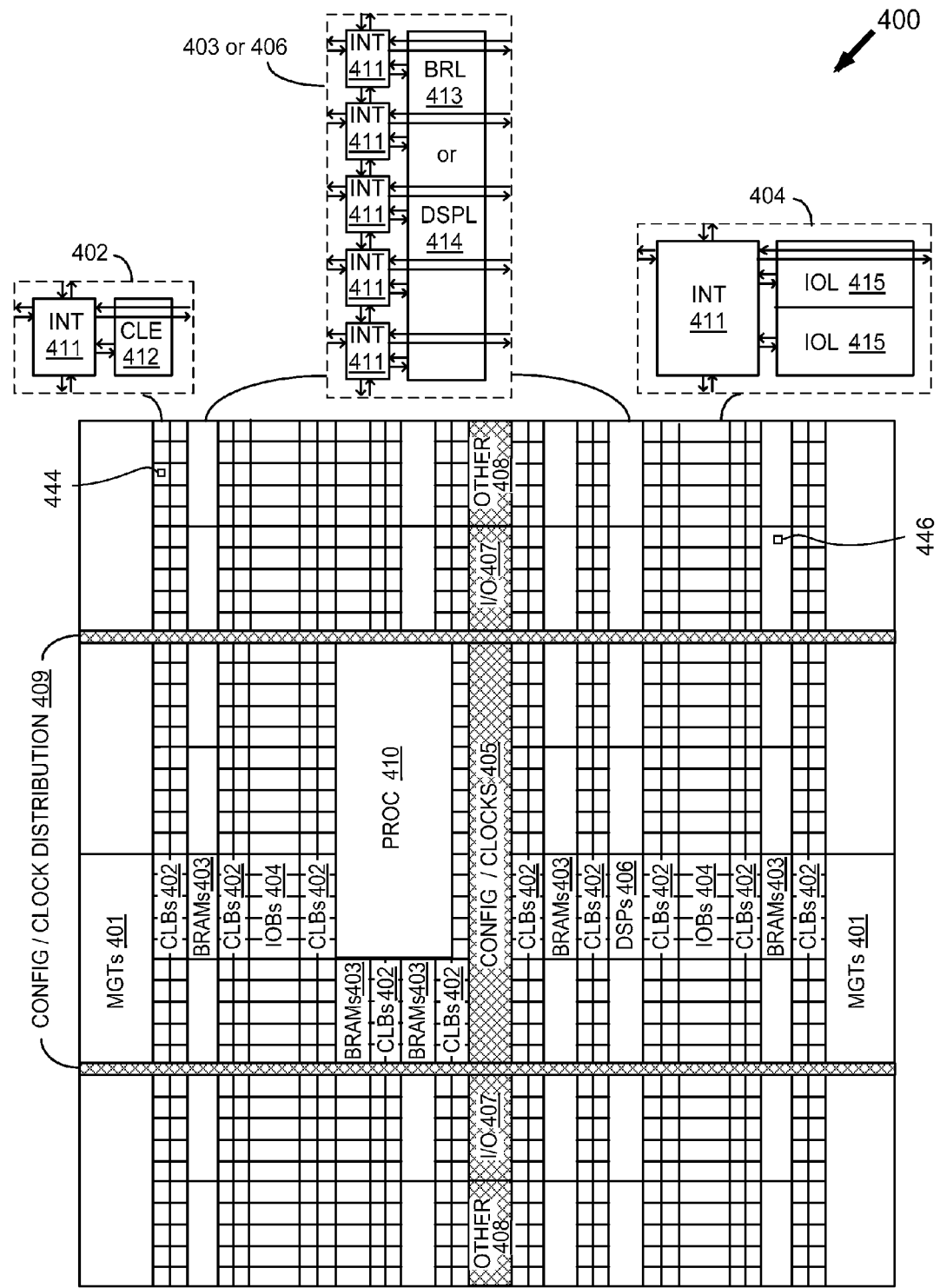
FIG. 4 is a plan view of an IC incorporating one or more embodiments of the invention.

FIG. 4 is a plan view of an integrated circuit 400 incorporating one or more embodiments of the invention. For illustrative purposes, an FPGA is shown here. For circuits in the FPGA with transistors located at the edge of diffusions (diffusion edge transistors), it may be desirable to place a dummy gate structure next to the diffusion edge transistors to correct possible stress non-uniformity that could cause a performance gap between the design target and actual performance. The IC 400 is an FPGA that includes CMOS portions in several of the functional blocks, such as in RAM and logic, and is fabricated using a CMOS fabrication process. One or more transistors or transistor arrays with dummy gate structures 444 according to one or more embodiments provide more uniform stress and therefore more predictable transistor performance. Embodiments are incorporated in any of several functional blocks of the FPGA, such as CLB, Block RAM (BRAM), and in a particular embodiment include a transistor or transistor array with a dummy gate structure abutting, overlying, or partially overlying a butting diffusion (tap) 446.

The FPGA architecture includes a large number of different programmable tiles including multi-gigabit transceivers (MGTs 401), configurable logic blocks (CLBs 402), random access memory blocks (BRAMs 403), input/output blocks (IOBs 404), configuration and clocking logic (CONFIG/CLOCKS 405), digital signal processing blocks (DSPs 406), specialized input/output blocks (I/O 407) (e.g., configuration ports and clock ports), and other programmable logic 408 such as digital clock managers, analog-to-digital converters, system monitoring logic, and so forth. Some FPGAs also include dedicated processor blocks (PROC 410).

In some FPGAs, each programmable tile includes a programmable interconnect element (INT 411) having standardized connections to and from a corresponding interconnect element in each adjacent tile. Therefore, the programmable interconnect elements taken together implement the programmable interconnect structure for the illustrated FPGA. The programmable interconnect element (INT 411) also includes the connections to and from the programmable logic element within the same tile, as shown by the examples included at the top of FIG. 4.

For example, a CLB 402 can include a configurable logic element (CLE 412) that can be programmed to implement user logic plus a single programmable interconnect element (INT 411). A BRAM 403 can include a BRAM logic element (BRL 413) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 406 can include a DSP logic element (DSPL 414) in addition to an appropriate number of programmable interconnect elements. An IOB 404 can include, for example, two instances of an input/output logic element (IOL 415) in addition to one instance of the programmable interconnect element (INT 411). As will be clear to those of skill in the art, the actual I/O pads connected, for example, to the I/O logic element 415 are manufactured using metal layered above the various illustrated logic blocks, and typically are not confined to the area of the input/output logic element 415. In the pictured embodiment, a columnar area near the center of the die (shown shaded in FIG. 4) is used for configuration, clock, and other control logic.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, the processor block PROC 410 shown in FIG. 4 spans several columns of CLBs and BRAMs.

Note that FIG. 4 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 4 are purely exemplary. For example, in an actual FPGA more than one adjacent column of CLBs is typically included wherever the CLBs appear, to facilitate the efficient implementation of user logic. Note also that, while the foregoing description of embodiments of the present invention are implemented in an FPGA, other embodiments can be implemented in any CMOS circuit.

Figure 5:
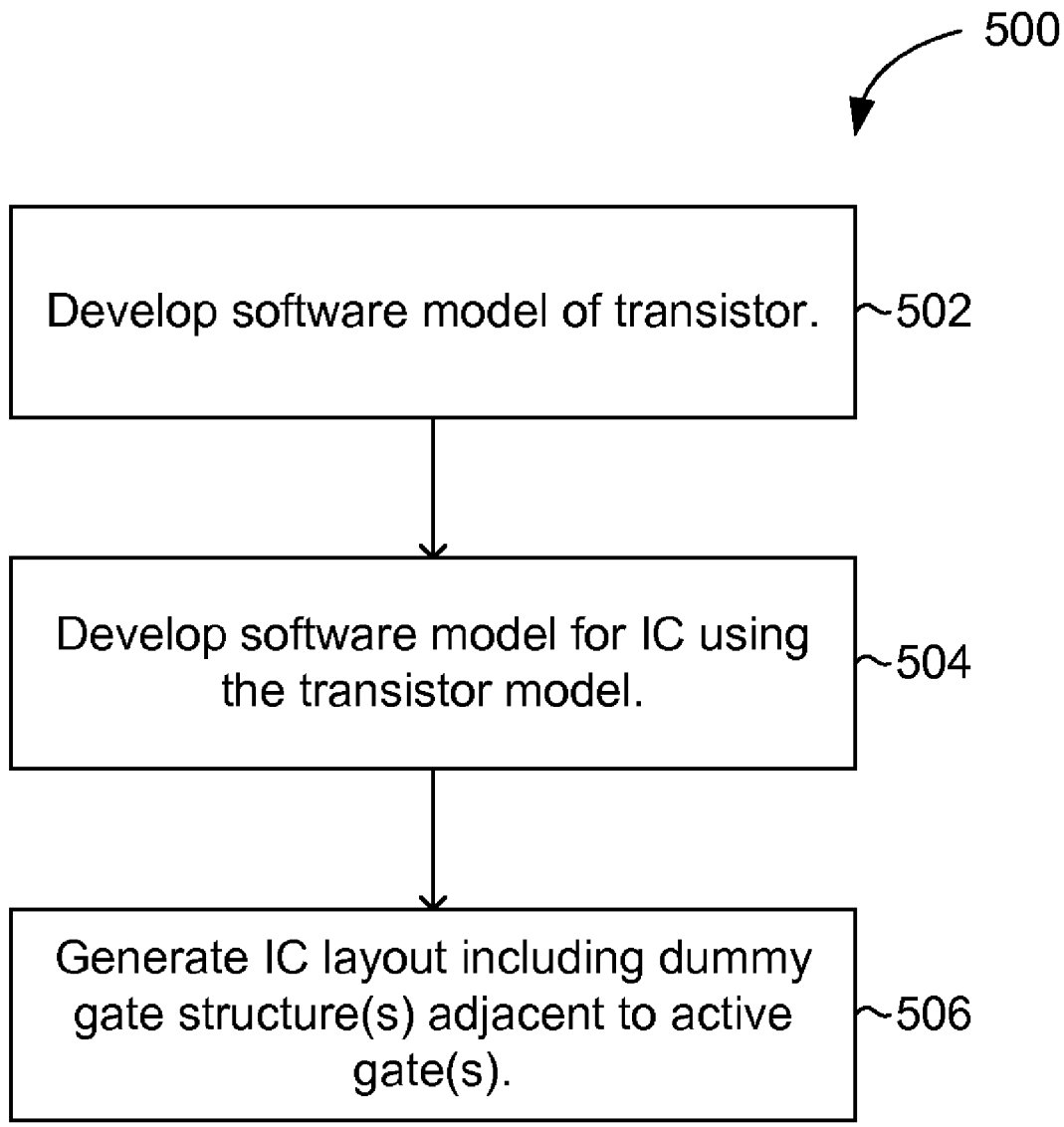
FIG. 5 is a flow chart of a method of designing an IC according to an embodiment.

FIG. 5 is a flow chart of a method of designing an IC 500 according to an embodiment. A software model of a transistor is developed (502), such as a SPICE™ model of a transistor. The transistor is a MOSFET, and the IC uses a stress layer over transistors in the IC to enhance carrier mobility. The transistor model includes stress-enhanced carrier mobility for the transistor. A software model for the IC is developed (step 504) that incorporates several instantiations of the transistor software model. A layout of the IC is generated (step 506) that includes a dummy gate structure adjacent to an active gate structure separated by a distance selected to conform the actual transistor performance to the modeled transistor performance. In a particular embodiment, the transistor is an end transistor in a transistor array of the IC. In a further embodiment, the dummy gate structure matches performance of the end transistor to another transistor in the transistor array. In a particular embodiment, the IC is an FPGA.

What is claimed is:

1. An integrated circuit comprising:
   a transistor having an active gate structure overlying an active diffusion area formed in a semiconductor substrate;
   a contact electrically connected to the active diffusion area, the contact comprising a source/drain contact of the active gate structure;
   a butting diffusion area formed in the semiconductor substrate adjacent to the active diffusion area, wherein the butting diffusion area is doped different from the active diffusion area;
   wherein the contact overlies the active diffusion area and does not overlie the butting diffusion area;
   a dummy gate structure at least partially disposed over the butting diffusion area and separated from the active gate structure by a selected distance, the dummy gate structure being electrically coupled to the contact; and
   a stress layer overlying the transistor producing stress in a channel region of the transistor.

2. The integrated circuit of claim 1, further comprising:
   a transistor array disposed on the semiconductor substrate;
   wherein the transistor is an end transistor in the transistor array having a plurality of active gate structures, and the selected distance is selected so as to match conduction characteristics of the transistor to a second transistor of the transistor array.

3. The integrated circuit of claim 2 wherein the second transistor is adjacent to the transistor in the transistor array and has a second active gate structure separated from the active gate structure by the selected distance.

4. The integrated circuit of claim 1 wherein the dummy gate structure is separated from a field oxide region by a setback.

5. The integrated circuit of claim 1, wherein the dummy gate structure overlies a boundary between the active diffusion area and the butting diffusion area.

6. The integrated circuit of claim 1 further comprising:
   a transistor array disposed on the semiconductor substrate, and the transistor is a transistor in the transistor array; and
   a second dummy gate structure separated from the active gate structure of the transistor array by the selected distance.

7. The integrated circuit of claim 2 further comprising a second dummy gate structure separated from a second active gate structure of a second end transistor in the transistor array by the selected distance.

8. The integrated circuit of claim 2 further comprising an on-field dummy strip separated from a second active gate structure of a second end transistor in the transistor array by the selected distance.

9. The integrated circuit of claim 2 wherein each of the plurality of active gate structures is separated from adjacent active gate structures by the selected distance.

10. The integrated circuit of claim 2 wherein each of the plurality of active gate structures and the dummy gate structure comprise polysilicon.

11. The integrated circuit of claim 2 wherein each of the plurality of active gate structures and the dummy gate structure comprise metal.

12. A method of designing an integrated circuit (IC) comprising:
    developing a transistor software model;
    developing an integrated circuit software model incorporating a plurality of instantiations of the transistor software model;
    generating a layout of the integrated circuit including an electrically biased dummy gate structure electrically connected to ground or Vcc of the integrated circuit adjacent to a transistor modeled according to the transistor software model, the electrically biased dummy gate structure conforming actual performance of the transistor to modeled performance of the transistor;
    wherein the layout further includes:
    a transistor having an active gate structure overlying an active diffusion area formed in a semiconductor substrate;
    a contact electrically connected to the active diffusion area, the contact comprising a source/drain contact of the active gate structure, the contact being electrically coupled to the dummy gate structure;
    a butting diffusion area formed in the semiconductor substrate adjacent to the active diffusion area, wherein the butting diffusion area is doped different from the active diffusion area, the dummy gate structure being at least partially disposed over the butting diffusion area; and
    a stress layer overlying the transistor producing stress in a channel region of the transistor; and
    wherein the contact overlies the active diffusion area and does not overlie the butting diffusion area.

13. The method of claim 12 wherein the integrated circuit is a field-programmable gate array.

14. The integrated circuit of claim 1 further comprising a second contact, the dummy gate structure being disposed between the contact and the second contact, wherein the second contact is electrically coupled to the contact and to the dummy gate structure.

15. The integrated circuit of claim 1 wherein the dummy gate structure and the contact are electrically connected to one of a ground potential of the integrated circuit or a Vcc potential of the integrated circuit.

* * * * *